(12) United States Patent
Norwood et al.

(10) Patent No.: US 8,076,617 B2
(45) Date of Patent: Dec. 13, 2011

(54) NANOAMORPHOUS CARBON-BASED PHOTONIC CRYSTAL INFRARED EMITTERS

(76) Inventors: Robert A. Norwood, Tucson, AZ (US); Terje Skotheim, Tucson, AZ (US)

( * ) Notice: Subject to any disclaimer, the term of this patent is extended or adjusted under 35 U.S.C. 154(b) by 896 days.

(21) Appl. No.: 12/098,708

(22) Filed: Apr. 7, 2008

(65) Prior Publication Data

US 2011/0042589 A1  Feb. 24, 2011

Related U.S. Application Data

(60) Provisional application No. 60/922,229, filed on Apr. 6, 2007.

(51) Int. Cl.
A45D 20/40 (2006.01)
(52) U.S. Cl. .......... 219/407; 977/949
(58) Field of Classification Search .......... 392/407, 392/408–440; 977/94, 700–963
See application file for complete search history.

(56) References Cited

U.S. PATENT DOCUMENTS

| | | | |
|---|---|---|---|
| 5,128,587 A | 7/1992 | Skotheim et al. | |
| 5,148,462 A | 9/1992 | Spitsyn et al. | |
| 5,352,493 A | 10/1994 | Dorfman et al. | |
| 5,466,431 A | 11/1995 | Dorfman et al. | |
| 6,031,970 A | 2/2000 | Nordal et al. | |
| 6,261,424 B1 | 7/2001 | Goncharenko et al. | |
| 6,768,256 B1 | 7/2004 | Fleming et al. | |
| 6,991,847 B2 | 1/2006 | Padmanabhan et al. | |
| 7,078,697 B2 | 7/2006 | Barker et al. | |
| 7,223,442 B2 | 5/2007 | Sidorova et al. | |
| 2003/0206959 A9* | 11/2003 | Kipp et al. | 424/489 |
| 2006/0071585 A1 | 4/2006 | Wang et al. | |
| 2006/0222710 A1* | 10/2006 | Kipp et al. | 424/484 |
| 2007/0018077 A1 | 1/2007 | Puscasu et al. | |
| 2007/0034978 A1 | 2/2007 | Pralle et al. | |
| 2007/0165295 A1 | 7/2007 | Kim et al. | |
| 2007/0269178 A1 | 11/2007 | Sarukura et al. | |
| 2008/0030837 A1 | 2/2008 | Ashrit et al. | |
| 2008/0171687 A1* | 7/2008 | Desai et al. | 514/2 |
| 2009/0176957 A1* | 7/2009 | Pandit et al. | 526/340 |
| 2010/0085139 A1* | 4/2010 | Yan et al. | 336/221 |

OTHER PUBLICATIONS

Birner et al. (Mar. 2001) "Silicon-Based Photonic Crystals," *Adv. Mater.* 13(6):377-388.
Dmitriev et al. (2001) "Thermostable Resistors Based on Diamond-Like Carbon Films Deposited by CVD Method," *Diamond Relat. Mater.* 10:1007-1010.
Dorfman et al. (1992) "Diamond-Like Nanocomposites (DLN)," *Thin Solid Films* 212:267-273.

(Continued)

*Primary Examiner* — Daniel L Robinson
(74) *Attorney, Agent, or Firm* — Greenlee Sullivan P.C.

(57) ABSTRACT

Provided is a tunable radiation emitting structure comprising: a nanoamorphous carbon structure having a plurality of relief features provided in a periodic spatial configuration, wherein the relief features are separated from each other by adjacent recessed features, and wherein the nanoamorphous carbon comprises a total of from 0 to 60 atomic percent of one or more dopants of the dopant group consisting of: transition metals, lanthanoids, electro-conductive carbides, silicides and nitrides. In one embodiment, a dopant is selected from the group consisting of: Sc, Ti, V, Cr, Mn, Fe, Co, Ni, Cu, Zn, Y, Zr, Nb, Mo, Tc, Ru, Rh, Pd, Ag, Cd, La and other lanthanides, Hf, Ta, W, Rh, Os, Ir, Pt, Au, and Hg. In one embodiment, a dopant is selected from the group consisting of: electro-conductive carbides (like $Mo_2C$), silicides (like $MoSi_2$) and nitrides (like TiN).

24 Claims, 9 Drawing Sheets

OTHER PUBLICATIONS

Johnson et al. (Feb. 3, 2003) "Introduction to Photonic Crystals: Bloch's Theorem, Band Diagrams, and Gaps (But No Defects)," *Pamphlet.* http://ab-initio.mit.edu/photons/tutorial/photonic-intro.pdf.

Kirpilenko et al. (2006) "Synthesis, Characterization and Nanostructuring of (a-C:H):Si and (a-C:H):SiMetal Films," *Diamond Relat. Mater.* 15:1147-1150.

Luo et al. (2004) "Thermal Radiation from Photonic Crystals: A Direct Calculation," *Phys. Rev. Lett.* 93:213905.1-213905.4.

Matsui et al. (Mar. 29, 2007) "Transmission Resonances Through Aperiodic Arrays of Subwavelength Apertures," *Nature* 446:517-521.

Norwood et al. (2006) "New Organic Infiltrants for 2-D and 3-D Photonic Crystals," *Proceedings of SPIE*, Linear and Nonlinear Optics of Organic Materials VI 6331:6331A.1-63310A.11.

Ohlckers et al. (2008) "Advantages and Limitations of Diamond-Like Carbon as a MEMS Thin Film Material," Abstract presented at the 11th Annual NSTI Nanotech Conference, Hynes Convention Center, Boston, Mass. Jun. 1-5.

Ordal et al. (1985) :Optical Properties of Fourteen Metals in the Infrared and Far Infrared: Al, Co, Cu, Au, Fe, Pb, Mo, Ni, Pd, Pt, Ag, Ti, V and W, *Appl. Opt.* 24:4493-4499.

Parker et al. (Aug. 2000) "Photonic Crystals," *Physics Web* http://physicsworld.com/cws/article/print/530.

Pralle et al. (2002) "Photonic Crystal Enhanced Narrow-Band Infrared Emitters," *Appl. Phys. Lett.* 81:4685-4687.

Welsh et al. (2007) "Terahertz-Pulse Emission Through Laser Excitation of Surface Plasmons in a Metal Grating," *Phys. Rev. Lett.* 98:026803.1-026803.4.

* cited by examiner

NANOAMORPHOUS CARBON-BASED PHOTONIC CRYSTAL INFRARED EMITTERS

CROSS-REFERENCE TO RELATED APPLICATIONS

This application claims priority to U.S. provisional application Ser. No. 60/922,229, filed Apr. 6, 2007, which is hereby incorporated by reference to the extent not inconsistent with the disclosure herewith.

STATEMENT REGARDING FEDERAL RESEARCH SUPPORT

This invention was made with government support under Contract Number DE-FG02-03ER83687 awarded by the Department of Energy. The government has certain rights in the invention.

BACKGROUND OF THE INVENTION

Infrared emitters and sensors are used in a variety of applications, such as air quality monitoring, exhaust gas analysis, glucose sensing, volatile agent sensing, process controls and monitoring, demand controlled ventilation, and enclosed space safety monitoring. Certain infrared emitters have been described, such as the emitter in U.S. Pat. No. 6,031,970; and the layered semiconductor-dielectric-metal structures in US 2007/0018077 and US 2007/0034978. However, there remains a need in the art for improved infrared sensors and emitters.

SUMMARY OF THE INVENTION

This invention provides sensors and emitters which operate generally in the infrared wavelength range. The provided sensors and emitters are wavelength tunable, and can be designed with the desired material characteristics, so that the desired wavelengths or wavelength ranges are sensed or emitted. The provided devices are suitable for a broad range of applications. The devices provided here have a fast response time, produce little excess heat, are highly efficient, have narrow band emissions, and long life.

In a general sense, the devices provided herein are photonic crystals of nanoamorphous carbon films.

"Nanoamorphous carbon" ("NAC") refers to compositions having a generally amorphous substantially $sp^3$-bonded carbon network that also contains silicon and oxygen. Preparation of nanoamorphous carbon is described generally in U.S. Pat. No. 7,223,442 and "New organic infiltrants for 2-D and 3-D photonic crystals," Proceedings of SPIE, Linear and Nonlinear optics of organic materials, Conference No. 6, San Diego, Calif., 2006, vol. 6331, pp. 6331A.1-63310A.11; the disclosures of which are hereby incorporated by reference.

Nano-amorphous carbon is in the general class of diamond-like materials ("DLC"). NAC contains two structural networks. One of the networks is an amorphous carbon network. This network is stabilized by hydrogen atoms and can be characterized by the relative ratio of carbon atoms in $sp^3$ and $sp^2$ states. The second network is formed by silicon atoms and is stabilized by oxygen atoms. Presence of silicon oxides provides better smoothness of the NAC films compared with conventional DLC films. The networks are assumed to be interpenetrating and stabilize each other preventing any crystallization. These materials do not show any graphitization after heat-treatment up to 900° C. NAC coatings are hard, smooth, and chemically and thermally stable. Initially, such films were called diamond-like nanocomposites (DLN) [V. F. Dorfman, "*Diamond-like nanocomposites (DLN)*", Thin Solid Films, 212 (1992), pp. 267-273.].

NAC films can be deposited by a PECVD process using suitable silicon-organic precursors. To prepare a NAC film the precursor should be evaporated, decomposed, ionized and the ions or other active particles should reach the substrate surface with minimal gas-phase interactions. The substrate temperature should be lower than 800° C. to prevent surface mobility of atoms, and to provide suitable conditions for the formation of amorphous materials. The low pressure (4 mTorr or lower) hot-wire technique and RF (13.56 MHz) substrate bias are useful in the preparation of NAC films [U.S. Pat. No. 5,466,431 and U.S. Pat. No. 5,352,493, and V. K. Dmitriev, V. N. Inkin, G. G. Kirpilenko, B. G. Potapov, E. A. Ilyichev and E. Y. Shelukhin, "*Thermostable resistors based on diamond-like carbon films deposited by CVD method*", Diamond and Related Materials. Vol. 10, Iss. 3-7, March-July 2001, pp 1007-1010.].

During deposition, NAC materials can be doped with metal atoms and other substances using magnetron sputtering. Such doping can be used to control electrical resistance of the films over a very wide range. Additionally, the incorporated atoms are believed to reduce inner stress on the doped NAC films [G. G. Kirpilenko, V. D. Frolov, E. V. Zavedeev, S. M. Pimenov, V. I. Konov, E. Y. Shelukhin and E. N. Loubnin, "*Synthesis, characterization and nanostructuring of (a-C:H):Si and (a-C:H):Si:Metal films*". Diamond and Related Materials. Vol. 15, Iss. 4-8, Apr.-Aug. 2006, pp. 1147-1150.].

The nanoamorphous carbon used herein can be doped with one or more metals and other materials. Metal dopants or other desired additional elements or materials may be co-deposited or sputtered during the growth of the film. The incorporated materials are amorphous. In one embodiment, the devices here are formed by plasma enhanced chemical vapor deposition ("PECVD"). Typical deposition rates for undoped NAC films are as high as 5 nm/min, although other deposition rates can be used. The NAC films may be grown at ambient temperatures. Metal-doped NAC materials have different conductivity and dielectric constant than non-doped NAC. The resistivity of the film is controlled by controlling the composition during film growth. Dielectric NAC films have conductivities around $10^{-10}$ S/cm. The conductivity of metal-doped NAC films can be selected from that of dielectric materials to about $10^3$ S/cm or higher. Doped NAC films can be used at higher temperatures than other materials. For example, NAC films doped with metals can be used in air at temperatures up to around 800° C. This characteristic provides an important feature in the use of doped NAC films for IR emission.

The NAC films provided here may have any suitable or desired thickness. A thicker film may be desired for certain applications, such as to provide additional device structural stability. A thinner film may be desired for other applications. Typical NAC film thickness values are from 1 nm to 10 microns, although thinner and thicker films can be used. In one embodiment, an IR emitter has a NAC film thickness of 20 nm. In one embodiment, an IR emitter has a NAC film thickness of 1 micron. In one embodiment, an IR emitter has a NAC film thickness of 10 microns. There is no absolute limit to the thickness of the NAC film since the films have excellent mechanical properties and resist cracking.

In the present invention, optionally doped NAC films can be deposited on photonic crystal templates, such as polymer templates, and the template subsequently removed by any suitable method, if desired. The template can be burned away, for example. The template can also remain in the system, if desired, according to the principle of conformally coated photonic crystals. In separate embodiments, the NAC can be deposited on metals, ceramics, semiconductors and plastic.

In operation, structures of the invention emit light when heated. The structures can be heated using any suitable means, such as application of electric field to produce a current (Ohm heating), or radiative heating. IR emission occurs at any temperature above absolute zero. At higher temperatures, there is a greater level of IR emission. In general, temperatures over 300° C. are used for useful levels of infrared light emission. Structures of the invention may also be used as sensors, where there is a current difference when light within the wavelength range of the sensor is applied.

In one embodiment, arrays of NAC photonic crystal ("PC") IR emitters can be made that are responsive to different center frequencies. These arrays can be used for different applications, such as detectors for individual gases or volatile compounds of interest, for example carbon monoxide, carbon dioxide, volatile organic compounds, chlorofluorocarbons, methane and other hydrocarbon gases.

The size of the devices can vary depending on the desired application, in according to the fabrication limitations.

More specifically, provided is a tunable radiation emitting structure comprising: a nanoamorphous carbon structure having a plurality of relief features provided in a periodic spatial configuration, wherein the relief features are separated from each other by adjacent recessed features, and wherein the nanoamorphous carbon comprises a total of from 0 to 60 atomic percent of one or more dopants of the dopant group consisting of: transition metals, lanthanoids, electro-conductive carbides, silicides and nitrides. In one embodiment, a dopant is selected from the group consisting of: Sc, Ti, V, Cr, Mn, Fe, Co, Ni, Cu, Zn, Y, Zr, Nb, Mo, Tc, Ru, Rh, Pd, Ag, Cd, La and other lanthanides, Hf, Ta, W, Rh, Os, Ir, Pt, Au, and Hg. In one embodiment, a dopant is selected from the group consisting of: electro-conductive carbides (like $Mo_2C$), silicides (like $MoSi_2$) and nitrides (like TiN). All ranges of dopants, including all individual values and intermediate ranges therein are intended to be included to the extent as if they were specifically mentioned. In one embodiment, the nanoamorphous carbon contains a total of from 5 to 25 atomic percent of dopants. In one embodiment, the nanoamorphous carbon contains a total of from 25 to 35 atomic percent of one or more dopants.

In one embodiment, a dopant is selected from the group consisting of: Sc, Ti, V, Cr, Mn, Fe, Co, Ni, Cu, Zn, Y, Zr, Nb, Mo, Tc, Ru, Rh, Pd, Ag, Cd, La and other lanthanides, Hf, Ta, W, Rh, Os, Ir, Pt, Au, Hg, electro-conductive carbides, silicides and nitrides. In one embodiment, a dopant is selected from the group consisting of: gold, silver, copper, iron, iridium, tungsten, molybdenum, nickel, vanadium, chromium, titanium, and TiN. In one embodiment, the center wavelength of emission is selected by changing the distance between relief features. In one embodiment, the distance between relief features is 1.5 microns. In one embodiment, the distance between relief features is from 1 micron to 10 microns. In one embodiment, the center wavelength of emission is between 0.750 microns to 1000 microns. In one embodiment, the center wavelength of emission is between 1-12 microns. In one embodiment, the center wavelength of emission is selected from 1-3 microns, 3-5 microns and 8-12 microns. In one embodiment, the center wavelength of emission is in the infrared wavelength range. In one embodiment, the relief features form a photonic crystal structure. In one embodiment, the width of the emission is selected by changing the refractive index of the nanoamorphous carbon. In one embodiment, the conductivity is selected from $10^{-10}$ S/cm to $10^3$ S/cm. In one embodiment, the width of emission is between 10 and 100 nm, 100-500 nm and 500 nm and 1 micron.

DETAILED DESCRIPTION OF THE INVENTION

Figure 1:
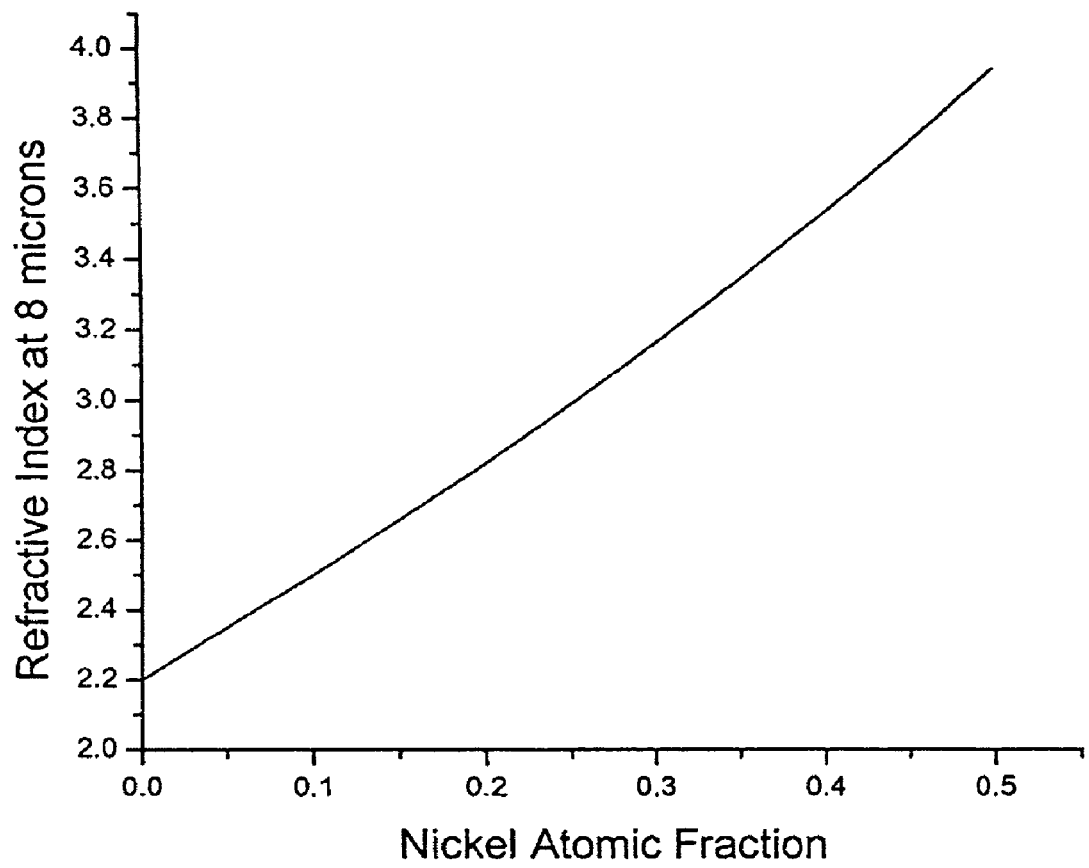
FIG. 1 shows the refractive index of Ni-doped NAC at 8 μm as a function of nickel concentration.

Photonic crystals, also commonly referred to as photonic bandgap structures, are periodic dielectric structures exhibiting a spatially periodic variation in refractive index that forbids propagation of certain frequencies of incident electromagnetic radiation. The photonic band gap of a photonic crystal refers to the range of frequencies of electromagnetic radiation for which propagation through the structure is prevented in particular directions. A photonic crystal structure may be designed to exhibit extraordinarily high reflection efficiency at particular wavelengths, at which optical standing waves develop and resonate within the photonic crystal structure. Such optical resonances are known to occur at the wavelengths adjacent to the photonic band gap, sometimes referred to as the photonic band edge. The spatial arrangement and refractive indices of these structural domains generate photonic bands gaps that inhibit propagation of electromagnetic radiation centered about a particular frequency.

Photonic crystals provide an electromagnetic analog to electron-wave behavior observed in crystals where electron-wave concepts, such as dispersion relations, Bloch wave functions, van Hove singularities and tunneling, have electromagnetic counterparts in photonic crystals. In semiconductor crystals, for example, an electronic band gap of energy states for which electrons are forbidden results from a periodic atomic crystalline structure. By analogy, in a photonic crystal, a photonic band gap of forbidden energies (or wavelengths/frequencies) of electromagnetic radiation results from a periodic structure of a dielectric material where the periodicity is of a distance suitable to interact with incident electromagnetic radiation.

Selection of the physical dimensions, refractive indices and spatial distribution of structural domains of a photonic crystal provides an effective means of designing a photonic crystal having a photonic band gap with a selected frequency distribution. One-dimensional, two-dimensional and three-dimensional photonic crystals have been fabricated providing complete or at least partial photonic bands having selected frequency distributions gaps in one or more directions. Photonic crystals have also been fabricated having selected local disruptions (e.g., missing or differently-shaped portions of the structural domains of periodic array) in their periodic structure, thereby generating defect or cavity modes with frequencies within a forbidden bandgap of the crystal. Photonic crystals having specific defects are of particular interest because they provide optical properties useful for controlling and manipulating electromagnetic radiation, such as the ability to provide optical confinement and/or wave guiding with very little, or essentially no, radiative losses.

As diffraction and optical interference processes give rise to the photonic band gap phenomenon, the periodicity of photonic crystal structures is typically on the order of the wavelength of incident electromagnetic radiation. Accordingly, photonic crystals for controlling and manipulating visible and ultraviolet electromagnetic radiation typically comprise dielectric or metallic structures with periodic structural domains having submicron physical dimensions on the order of 100 s nanometers. A number of fabrication pathways for making periodic structures having these physical dimensions have been developed over the last decade, including micromachining and nanomachining techniques (e.g., lithographic patterning and dry/wet etching, electrochemical processing etc.), colloidal self assembly, layer-by-layer assembly and interference lithography. Advances in these fabrication techniques have enabled fabrication of one-dimensional, two-dimensional and three-dimensional photonic crystals from a range of materials including dielectric crystals, metallic, polymeric and colloidal materials.

The structure, composition, fabrication and optical properties of photonic crystals are described in the following references which are hereby incorporate by reference in their entireties: (1) Joanopoulus et al., "Photonic Crystals Molding the Flow of Light", Princeton University Press, 1995; (2) A. Birner, R. B. Wehrspohn, U. M. Gösele, K. Busch, "Silicon-Based Photonic Crystals", Advanced Materials, Volume 13, Issue 6, Pages 377-388; and (3) Steven G. Johnson, and John D. Joannopoulos, "Photonic Crystals The Road from Theory to Practice", Springer, 2002. However, not all wavelength ranges are accessible from the current techniques.

As used herein, "photonic crystal structure" is a structure having a periodic modulation of refractive index in 1, 2, or 3 spatial dimensions.

The term "electromagnetic radiation" and "light" are used synonymously in the present description and refer to waves of electric and magnetic fields. Electromagnetic radiation useful for the methods of the present invention includes infrared light.

"Feature" refers to a three-dimensional structure or component of a structure. Features may be recessed in which they extend into a surface or may be relief features embossed or raised on a substrate surface. Features include, but are not limited to, trenches, cavities, vias, channels, posts, slots, stands, columns, ribbons or any combination of these. The term feature, as used herein, also refers to a pattern or an array of structures, and encompasses patterns of nanostructures, patterns of microstructures, patterns of larger structures, or a pattern of microstructures and/or nanostructures and/or larger structures.

"Optical communication" refers to a configuration of two or more elements wherein one or more beams of electromagnetic radiation are capable of propagating from one element to the other element. Elements in optical communication may be in direct optical communication or indirect optical communication. "Direct optical communication" refers to a configuration of two or more elements wherein one or more beams of electromagnetic radiation propagate directly from a first device element to another without use of optical components for steering and/or combining the beams. "Indirect optical communication" on the other hand refers to a configuration of two or more elements wherein one or more beams of electromagnetic radiation propagate between two elements via one or more device components including, but not limited to, wave guides, fiber optic elements, reflectors, filters, prisms, lenses, gratings and any combination of these device components.

"Film" refers to a coating or layer of atoms, molecules or ions or mixtures and/or clusters thereof. Films in the present invention may comprise a single-layer having a substantially constant composition, a single-layer having a composition which varies as a function of physical thickness or a plurality of film layers. Film layers of the present invention include but are not limited dielectric materials, semiconductors, conducting materials, organic materials such as polymers and any combinations of these materials. In a preferred embodiment, reference to dielectric films in the present invention includes but is not limited to metal oxide, metalloid oxide and salt films. Film layers of the present invention may have any size, shape, physical thickness or optical thickness suitable for a selected application.

As used herein, "attach" does not necessarily mean a covalent bond is formed. Covalent or non-covalent interactions, such as hydrogen bonds, van der Waals interactions, ionic interactions, and other interactions may be formed when one structure attaches to another.

As used herein, "layer" does not necessarily mean that a complete layer is formed, but rather, defects or other areas of inconsistency may be found.

As used herein, a "square lattice" of relief features is an arrangement where four relief features form the vertexes of a square. The relief features themselves in a square lattice are not necessarily square; they may be circular, oval, square, rectangular, or any other convenient or desired shape. All photonic crystal arrangements of relief features, such as square lattice and other arrangements are included in the invention.

As used herein, "center wavelength of emission" is the wavelength (or small range of wavelengths, such as 10 s of nanometers) where the emission intensity is the highest average intensity for a given emission spectrum.

The following nonlimiting description is intended to provide examples of some embodiments of this invention.

Table 1 shows refractive indices of several metals at IR wavelengths of interest.

TABLE 1

Refractive indices of several metals at IR wavelengths of interest

| Metal | 3.1 µm | 4.0 µm | 8.3 µm | 12.5 µm |
|---|---|---|---|---|
| Au | 1.7 | 2.6 | 8.7 | — |
| Ag | 1.4 | 2.4 | 10.1 | — |
| Cu | 1.6 | 2.3 | 6.4 | 11.4 |
| Fe | 4.4 | 4.5 | 5.4 | 6.5 |
| Ir | 3.4 | 5.1 | 15.3 | 28.5 |
| Mo | 1.7 | 3.4 | 8.8 | 18.5 |
| Ni | 4.7 | 5.2 | 7.8 | 13.2 |
| Va | 1.6 | 2.1 | 6.6 | 12.8 |
| W | 1.9 | 1.8 | 6.7 | 14.1 |

This table shows at 12 µm, refractive indices greater than 10 are routinely obtained. Maxwell-Garnett theory can be used to estimate the refractive index of composite materials. By incorporation of metals into a NAC film, the refractive index can be changed to a wide range of values from dielectric to metal. The refractive index can be tuned from that of undoped NAC to beyond that of silicon. For example, materials with refractive index of 2 to 10 in the infrared can be created. FIG. 1 shows the refractive index of NAC at 8 μm as a function of nickel concentration.

Example 1

Undoped NAC PC Using a SU-8 Template

A 0.2 μm thick film of undoped NAC was deposited on a SU-8 template using PECVD. The SU-8 2-dimensional photonic crystal template was fabricated by multibeam interference lithography.

A PVD75 deposition system (Kurt J. Lesker) was modified to accommodate the PECVD process. The liquid precursor (poly phenyl methyl siloxane-PPMS) was delivered into the vacuum chamber through a quartz capillary tube by a digital HPLC Pump (Series 1500—ChromTech) at a rate of 3 μl/min. In the vacuum chamber PPMS was vaporized and decomposed/ionized using the hot-wire technique (tungsten wire). 150 V DC bias was applied between the hot-wire (−) and chamber wall (+). The substrate was RF-biased with RF power of 100 W and was under a negative potential of 600 VDC. The deposition process included the following stages: 1) evacuation to 10-6 Torr; 2) filling the chamber with Ar to pressure ~10-4 Torr; 3) heating of the hot-wire for 30 min to 2500° C.; 3) Ar+ ion etching of the substrate (using RF argon plasma generation) for 10 min; 4) injection of the PPMS into the vaporizer; 4) deposition of NAC for 1 hr.

Figure 2:
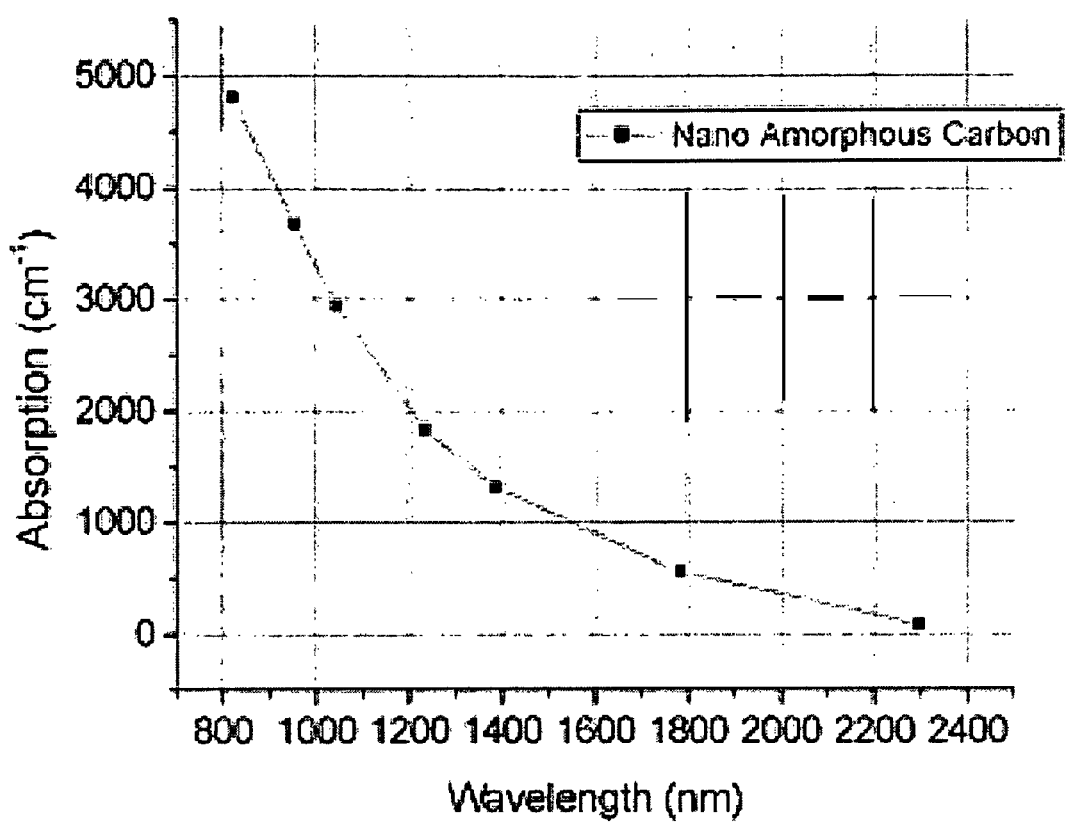
FIG. 2 shows the absorption coefficient of undoped NAC in the near IR.
Figure 3:
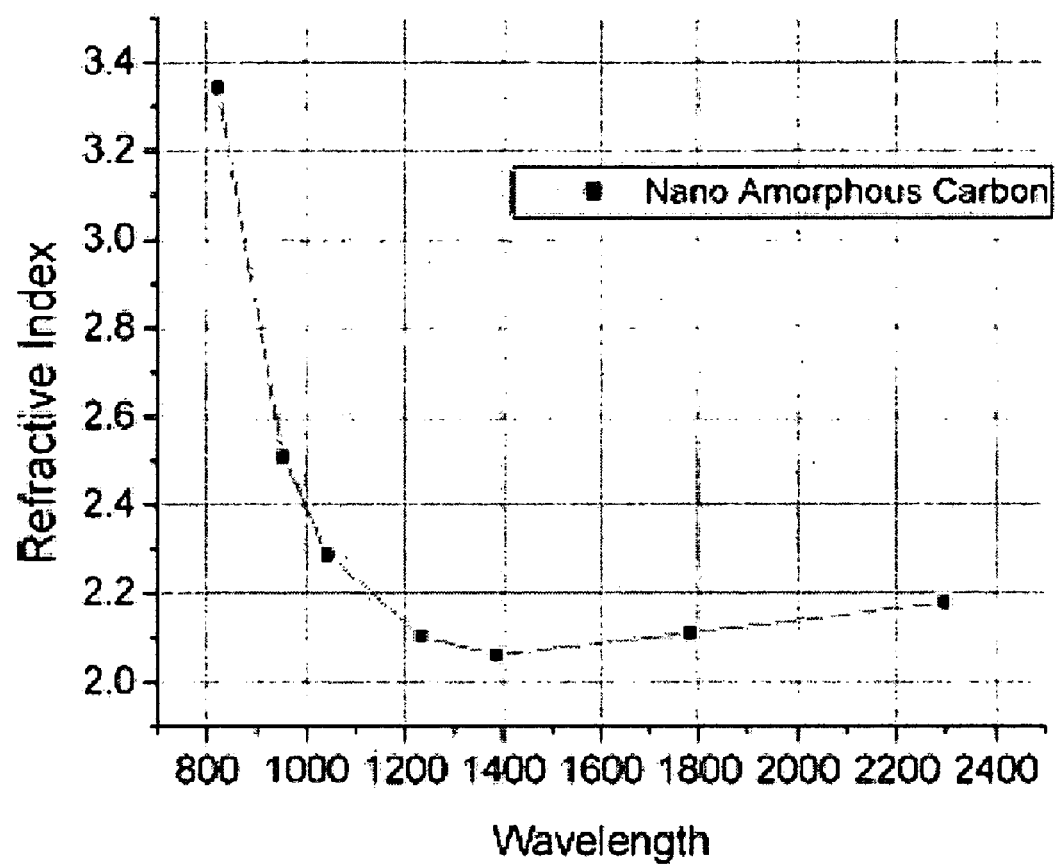
FIG. 3 shows the refractive index of undoped NAC in the near IR.

The absorption coefficient and refractive index of undoped NAC were measured in the near IR by careful reflection and transmission measurements over this full wavelength range and subsequent analysis. These results are shown in FIGS. 2 and 3.

Figure 4:
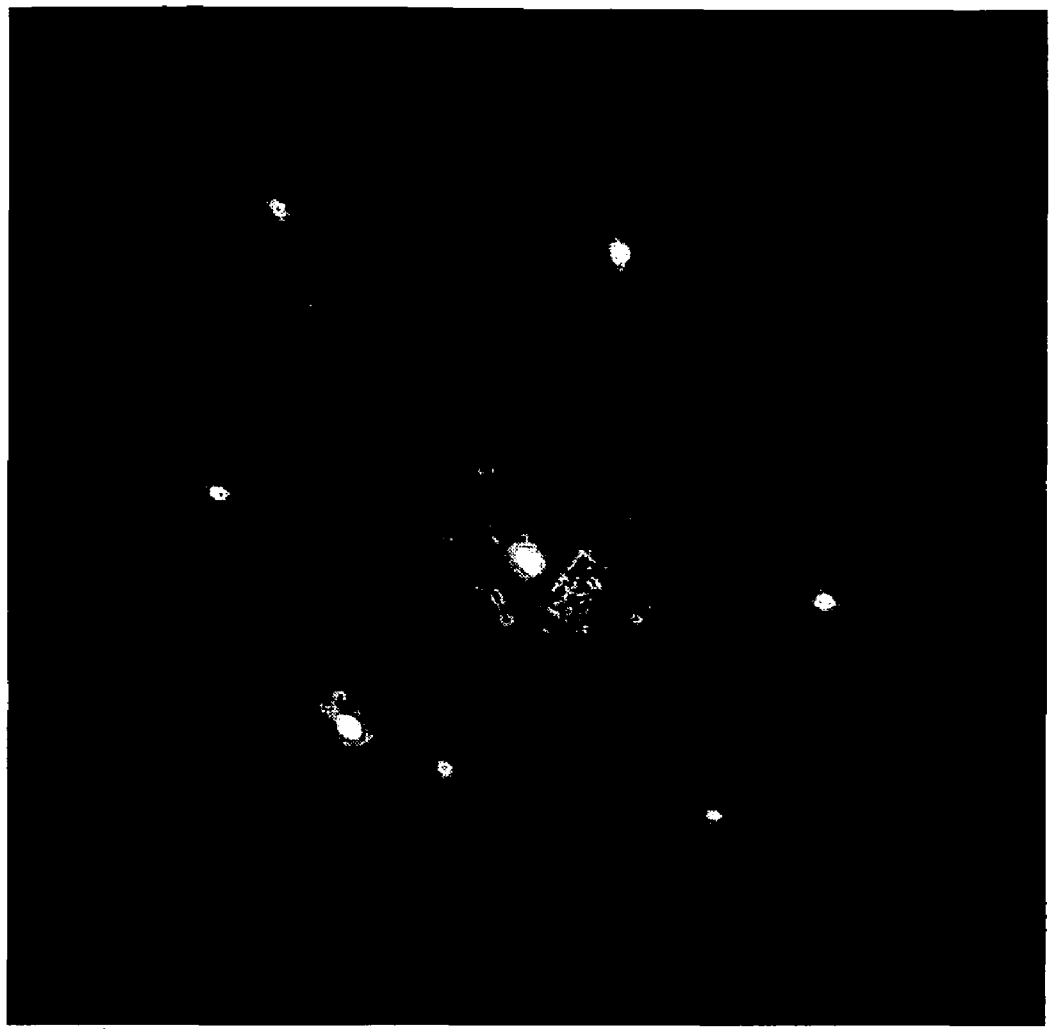
FIG. 4 shows diffraction of 632.8 nm radiation from a 2-D SU-8 photonic crystal infiltrated with NAC.
Figure 5:
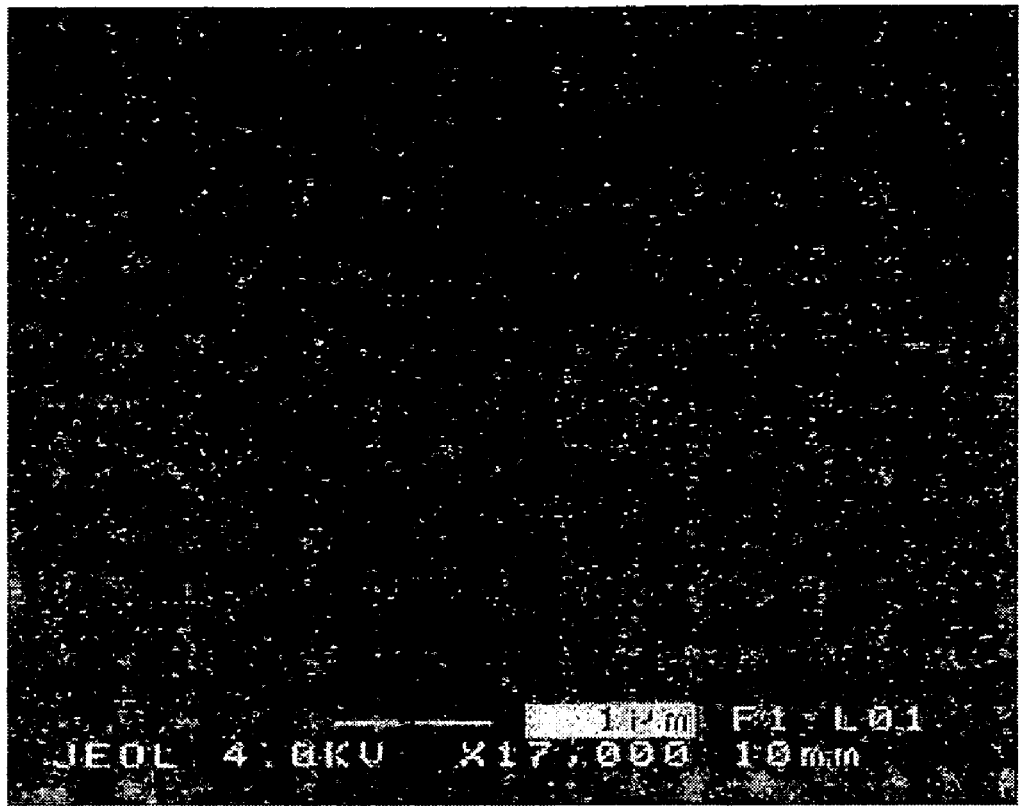
FIG. 5 shows the SEM of the sample in FIG. 4.

FIG. 4 shows diffraction of 632.8 nm radiation from a 2-D SU-8 photonic crystal infiltrated with NAC, showing the form of the diffraction pattern is as would be expected from a hexagonal matrix, demonstrating that the polymer template has survived the NAC deposition process. FIG. 5 is an SEM of the same sample, where the infiltrated NAC is clearly shown, as well as the spatial periodicity that produced the k-space pattern in FIG. 4.

Figure 6:
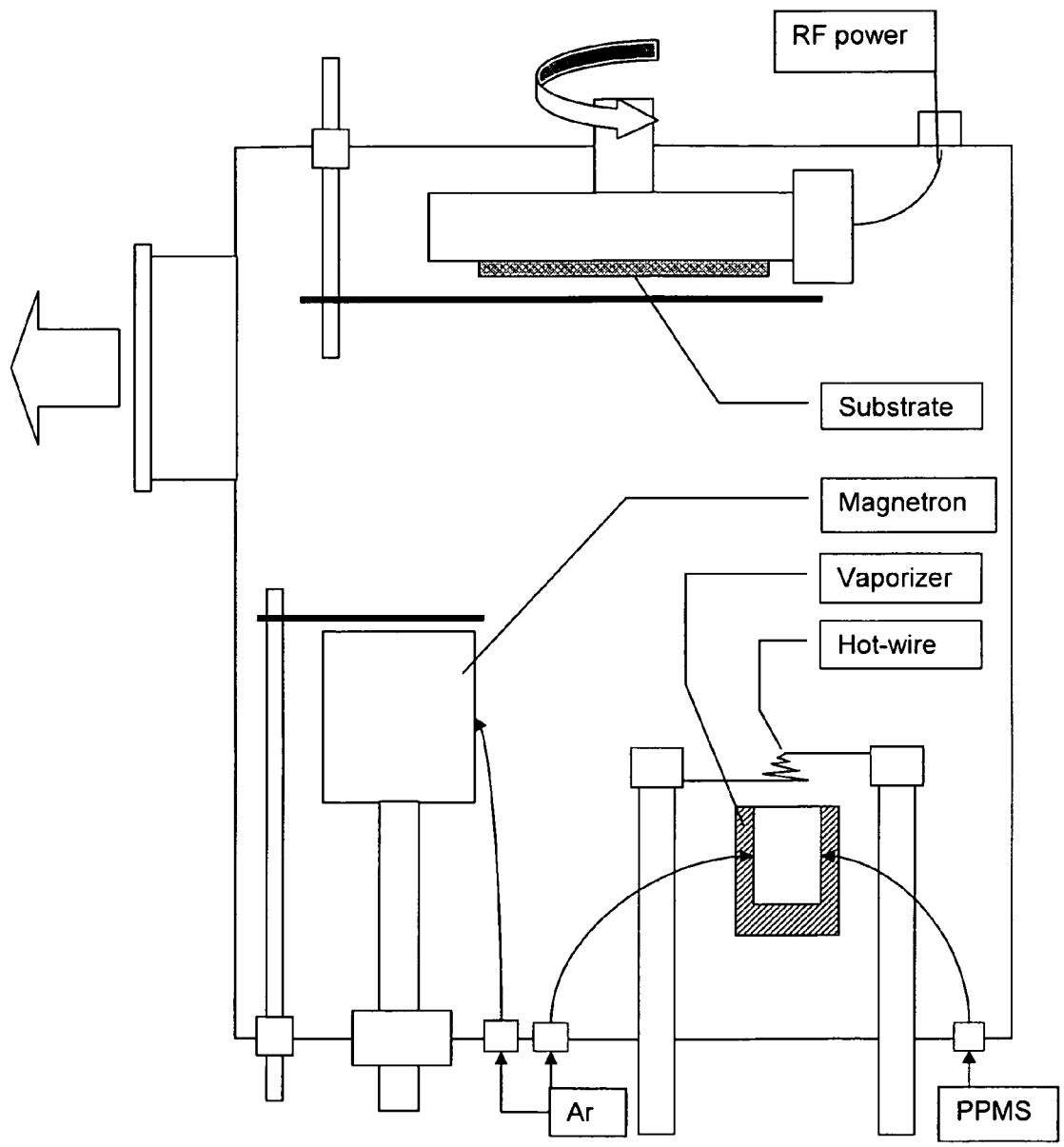
FIG. 6 shows a schematic of the PECVD system that was used for depositing NAC.

FIG. 6 is a schematic of the PECVD system that is used to deposit both NAC and doped NAC.

Figure 7:
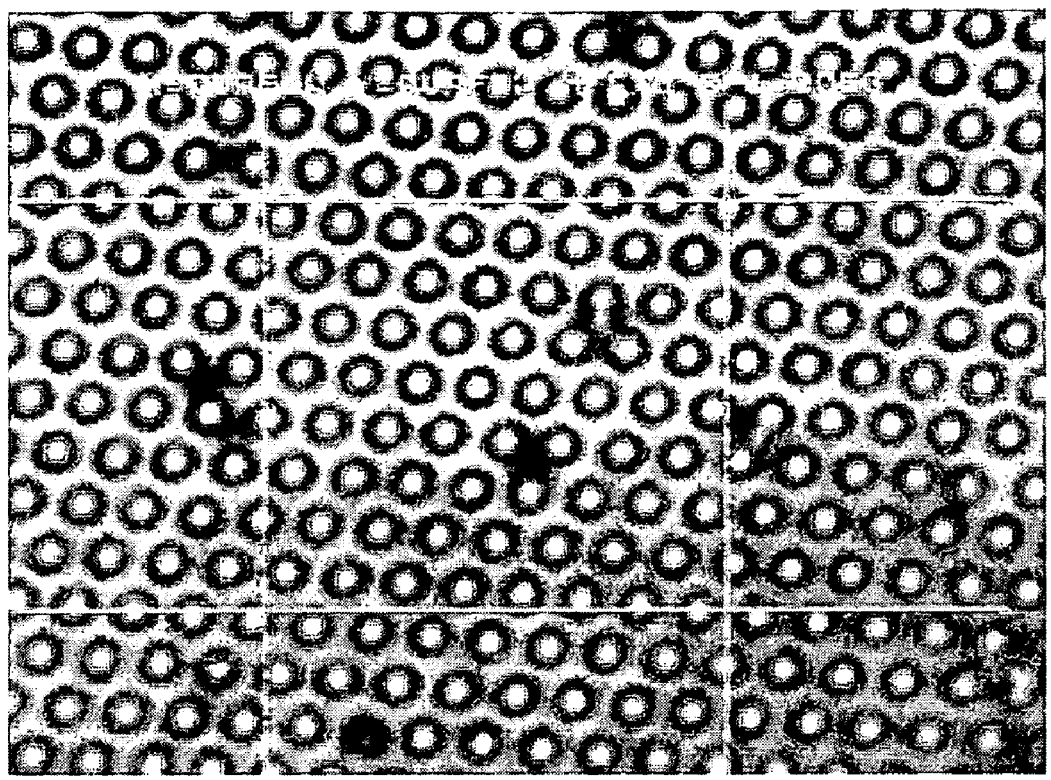
FIG. 7 shows an optical micrograph of an optimized NAC infiltrated SU-8 2-D photonic crystal.
Figure 8:
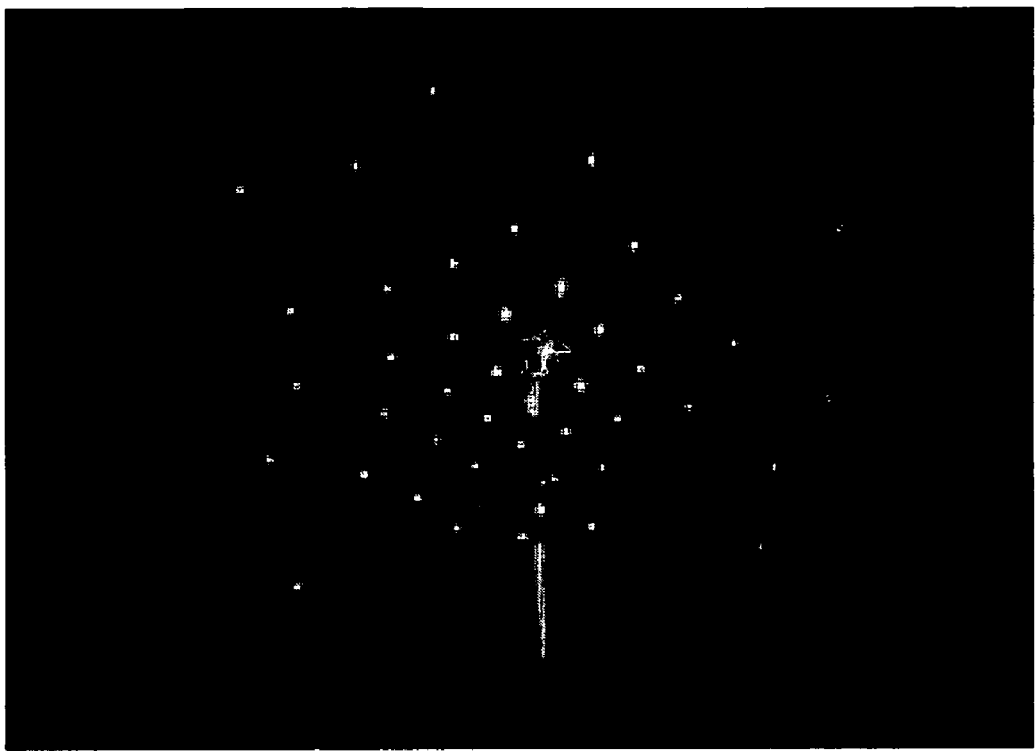
FIG. 8 shows the diffraction pattern at 532 nm from the sample of FIG. 7, evidencing the high quality of the sample through the low scattering and high number of diffraction orders observed.
Figure 9:
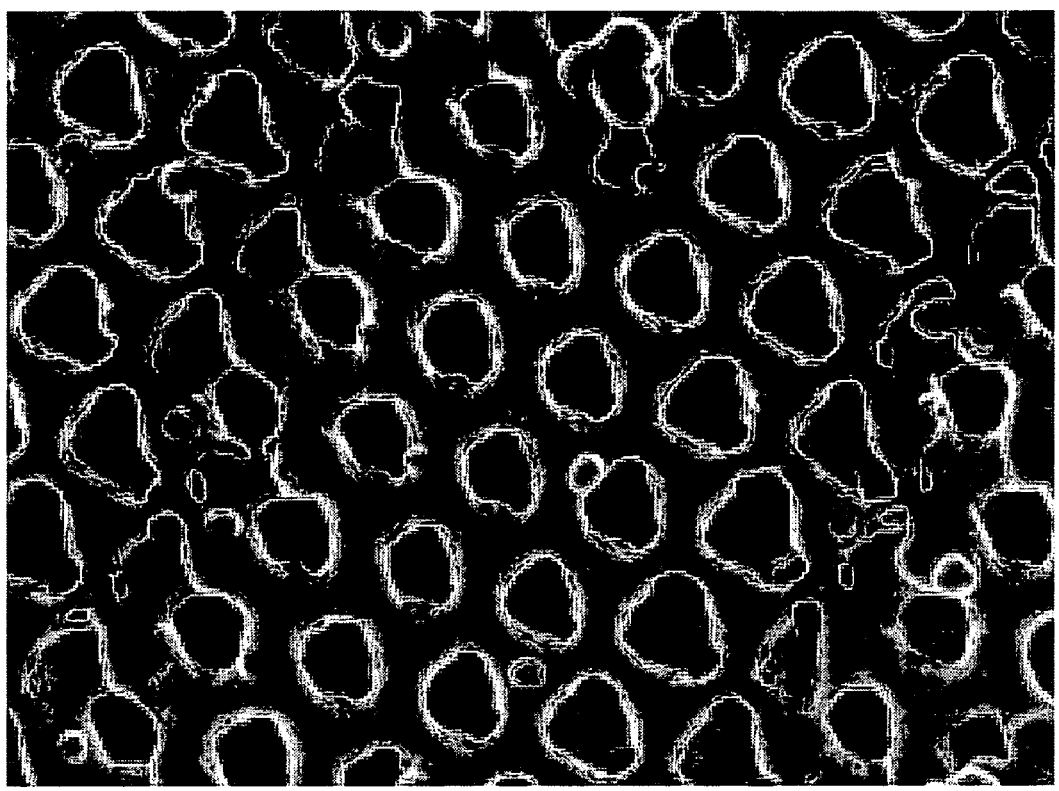
FIG. 9 is an SEM of an SU-8 3-D photonic crystal template that has been partially conformally coated with NAC.

An improved NAC deposition process was used to infiltrate a new SU-8 2D photonic crystal template and an optical micrograph of the resulting structure is shown in FIG. 7. In this case, the deposition rate and the temperature of the NAC were adjusted so as not to exceed 300-350°, the temperature at which the SU-8 template will begin to deform and decompose. The high quality of this structure is further evidenced by the beautiful diffraction pattern shown in FIG. 8, which shows very little scattering and a large number of diffraction orders, as would be expected for a high quality film. Further optimization of this process was performed to allow for conformal coating of a 3-D photonic crystal SU-8 template as shown in the SEM of FIG. 9.

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

All patents and publications mentioned in the specification are indicative of the levels of skill of those skilled in the art to which the invention pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art. For example, when a structure is claimed, it should be understood that structures known in the prior art, including certain structures disclosed in the references disclosed herein (particularly in referenced patent documents), are not intended to be included in the claim.

When a group of substituents is disclosed herein, it is understood that all individual members of those groups and all subgroups of the group members, and classes of group members that can be formed using the substituents are disclosed separately. When a Markush group or other grouping is used herein, all individual members of the group and all combinations and subcombinations possible of the group are intended to be individually included in the disclosure.

Every formulation or combination of components described or exemplified can be used to practice the invention, unless otherwise stated. Specific names of compounds and other materials are intended to be exemplary, as it is known that one of ordinary skill in the art can name the same compounds and materials differently. One of ordinary skill in the art will appreciate that methods, device elements, starting materials, synthetic methods, and analysis methods other than those specifically exemplified can be employed in the practice of the invention without resort to undue experimentation. All art-known functional equivalents, of any such methods, device elements, starting materials, synthetic methods, and analysis methods are intended to be included in this invention. Whenever a range is given in the specification, for example, a thickness range, a distance range, a diameter range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a structure or in a description of elements of a device, is understood to encompass those structures and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

In general the terms and phrases used herein have their art-recognized meaning, which can be found by reference to standard texts, journal references and contexts known to those skilled in the art. The definitions are provided to clarify their specific use in the context of the invention.

We claim:

1. A tunable radiation emitting structure comprising:
 a nanoamorphous carbon structure having a plurality of relief features provided in a periodic spatial configuration, wherein the relief features are separated from each other by adjacent recessed features, and wherein the nanoamorphous carbon comprises a total of from 0 to 60 atomic percent of one or more dopants of the dopant group consisting of: transition metals, lanthanoids, their electro-conductive carbides, silicides and nitrides.

2. The structure of claim 1, wherein a dopant is selected from the group consisting of: Sc, Ti, V, Cr, Mn, Fe, Co, Ni, Cu, Zn, Y, Zr, Nb, Mo, Tc, Ru, Rh, Pd, Ag, Cd, La and other lanthanides, Hf, Ta, W, Rh, Os, Ir, Pt, Au, Hg, electro-conductive carbides, silicides and nitrides.

3. The structure of claim 1, wherein a dopant is selected from the group consisting of: gold, silver, copper, iron, iridium, tungsten, molybdenum, nickel, vanadium, chromium, titanium, and TiN.

4. The structure of claim 1, wherein the nanoamorphous carbon contains a total of from 5 to 25 atomic percent of dopants.

5. The structure of claim 1, wherein the nanoamorphous carbon contains a total of from 25 to 35 atomic percent of dopants.

6. The structure of claim 1, wherein the center wavelength of emission is selected by changing the distance between relief features.

7. The structure of claim 1, wherein the relief features form a photonic crystal structure.

8. The structure of claim 1, wherein the width of the emission is selected by changing the refractive index of the nanoamorphous carbon.

9. The structure of claim 1, wherein the conductivity is selected from $10^{-10}$ S/cm to $10^3$ S/cm.

10. The structure of claim 1, wherein the distance between relief features is from 1.5 microns to 10 microns.

11. The structure of claim 1, wherein the distance between relief features is 1.5 microns.

12. The structure of claim 1, wherein the center wavelength of emission is in the infrared wavelength range.

13. The structure of claim 1, wherein the center wavelength of emission is between 0.750 microns to 1000 microns.

14. The structure of claim 1, wherein the center wavelength of emission is between 1-12 microns.

15. The structure of claim 1, wherein the center wavelength of emission is selected from 1-3 microns, 3-5 microns and 8-12 microns.

16. The structure of claim 1, wherein the width of emission is between 10 and 100 nm, 100-500 nm and 500 nm-1 micron.

17. The structure of claim 1, formed by plasma enhanced chemical vapor deposition on a template.

18. The structure of claim 1, wherein the template is lithographically or multibeam interference patterned SU-8.

19. The structure of claim 1, wherein the template is a photoresist that has been patterned by either or one or two-photon lithography, or an oxide that has been previously infiltrated within a photoresist template and can be dissolved by a strong acid.

20. A method of light emission, comprising:
 applying radiational energy to a structure of claim 1.

21. The method of claim 20 wherein the radiational energy is heat.

22. The method of claim 20, wherein the radiational energy is supplied by application of electric current resulting in Ohm heating.

23. The method of claim 20, wherein the structure is heated to above 300° C.

24. The method of claim 20, wherein the structure is heated to above 500° C.

* * * * *